(12) United States Patent
Ishii et al.

(10) Patent No.: US 8,253,909 B2
(45) Date of Patent: Aug. 28, 2012

(54) ELECTRO-OPTICAL DEVICE SUBSTRATE, ELECTRO-OPTICAL DEVICE, AND ELECTRONIC APPARATUS

(75) Inventors: Tatsuya Ishii, Fujimi-cho (JP); Masahiro Yasukawa, Chino-chi (JP); Minoru Moriwaki, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 1184 days.

(21) Appl. No.: 11/693,055

(22) Filed: Mar. 29, 2007

(65) Prior Publication Data
US 2007/0263156 A1 Nov. 15, 2007

(30) Foreign Application Priority Data
May 10, 2006 (JP) .................................. 2006-131084

(51) Int. Cl.
G02F 1/1343 (2006.01)
G02F 1/1333 (2006.01)
(52) U.S. Cl. ........... 349/143; 349/38; 349/110; 349/139
(58) Field of Classification Search ............. 349/38–39, 349/110–111, 139, 143
See application file for complete search history.

(56) References Cited

U.S. PATENT DOCUMENTS

| 6,521,913 | B1 | 2/2003 | Murade |
| 6,765,230 | B2 | 7/2004 | Murade |
| 6,770,909 | B2 | 8/2004 | Murade |
| 6,831,318 | B2 | 12/2004 | Yonekura et al. |
| 6,872,975 | B2 | 3/2005 | Murade |
| 6,927,808 | B2 | 8/2005 | Ono et al. |
| 7,224,032 | B2 | 5/2007 | Shiraki et al. |
| 7,242,440 | B2 | 7/2007 | Kurashina et al. |
| 2004/0085497 | A1* | 5/2004 | Kawata ......................... 349/111 |
| 2004/0135952 | A1* | 7/2004 | Kurashina et al. ............. 349/139 |
| 2004/0169812 | A1 | 9/2004 | Kim |
| 2005/0146649 | A1* | 7/2005 | Sato .............................. 349/44 |

FOREIGN PATENT DOCUMENTS

| JP | A-2001-021919 | 1/2001 |
| JP | A-2001-305580 | 10/2001 |
| JP | A-2002-98991 | 4/2002 |
| JP | A-2002-098991 | 4/2002 |
| JP | A-2002-244153 | 8/2002 |
| JP | A-2004-012730 | 1/2004 |
| JP | A-2004-85898 | 3/2004 |
| JP | A-2004-170915 | 6/2004 |
| JP | A-2004-193624 | 7/2004 |
| JP | A-2004-199074 | 7/2004 |
| JP | A-2005-107548 | 4/2005 |
| JP | A-2005-250448 | 9/2005 |
| JP | A 2005-301306 | 10/2005 |

* cited by examiner

Primary Examiner — Mark Robinson
Assistant Examiner — Charles Chang
(74) Attorney, Agent, or Firm — Oliff & Berridge, PLC

(57) ABSTRACT

An electro-optical device substrate includes a substrate, a plurality of data lines and a plurality of scanning lines crossing each other on the substrate, and a plurality of pixels defined by the plurality of data lines and the plurality of scanning lines so as to correspond to intersections thereof. Each pixel includes a pixel electrode, a conducting layer formed in a non-opening region separating an opening region of the pixel from that of another pixel, the conducting layer having a protruding portion protruding into the opening region from a part of one of a plurality of region edges defining the opening region, and a first contact portion electrically connecting the pixel electrode and the protruding portion.

13 Claims, 11 Drawing Sheets

ELECTRO-OPTICAL DEVICE SUBSTRATE, ELECTRO-OPTICAL DEVICE, AND ELECTRONIC APPARATUS

BACKGROUND

1. Technical Field

The present invention relates to a substrate used for an electro-optical device, for example, a liquid crystal device; an electro-optical device including such a substrate; and an electronic apparatus, for example, a liquid crystal projector, including such an electro-optical device.

2. Related Art

A liquid crystal device is an example of an electro-optical device. In a liquid crystal device, in order to prevent an image signal held in a pixel from leaking, a hold capacitor is added in parallel with a liquid crystal capacitor. Such a hold capacitor is formed in a non-opening region provided around an opening region in each of a plurality of pixels constituting a display region of the liquid crystal device. The opening region is a region surrounded by the non-opening region, and is often formed in a rectangular shape. In addition, in order to electrically connect the hold capacitor formed in the non-opening region and a transparent pixel electrode formed in the opening region above the hold capacitor, the pixel electrode is often provided with an extension located in the non-opening region over the hold capacitor, and a connector such as a contact hole is provided in the non-opening region so as to connect the extension and the hold capacitor (see JP-A-2005-301306).

The above-described known liquid crystal device has the following problems in manufacturing process and design. Liquid crystal devices are required to have a higher opening ratio to have higher image quality. However, if the widths of interconnects and the sizes of elements in the non-opening region are reduced, it is difficult to secure a space for providing a connector such as a contact hole. More specifically, for example, in the case where the width of the non-opening region is defined by the widths of interconnects, hold capacitors, and so forth provided between adjacent pixels, the opening ratio can be increased by reducing the widths of the interconnects and so forth. However, it is difficult to secure the size of a contact hole to be formed and the margin for alignment of a mask used for partly removing an insulating film when the contact hole is formed.

An advantage of some aspects of the invention is that there are provided a substrate used for an electro-optical device, such as an active-matrix addressed liquid crystal device, whose opening ratio can be increased, with the electrical connection between a hold capacitor and a pixel electrode in each pixel secured; an electro-optical device including such a substrate; and an electronic apparatus.

In a first aspect of the invention an electro-optical device substrate includes a substrate, a plurality of data lines and a plurality of scanning lines crossing each other on the substrate, and a plurality of pixels defined by the plurality of data lines and the plurality of scanning lines so as to correspond to intersections thereof. Each pixel includes a pixel electrode, a conducting layer formed in a non-opening region separating an opening region of the pixel from that of another pixel, the conducting layer having a protruding portion protruding into the opening region from a part of one of a plurality of region edges defining the opening region, and a first contact portion electrically connecting the pixel electrode and the protruding portion.

The electro-optical device substrate according to a first aspect of the invention is, for example, a TFT array substrate to be disposed opposite an opposing substrate for sandwiching liquid crystal, which is an example of an electro-optical material, or a plate-like structure including a TFT array substrate and components formed on the TFT array substrate. When an electro-optical device is in operation, each pixel is supplied with a scanning signal via a scanning line, and the pixel electrode of each pixel is supplied with an image signal via a data line. More specifically, the gate of a semiconductor element such as a thin film transistor (hereinafter referred to as "TFT") provided in each pixel for switching the pixel is electrically connected to a scanning line and is turned on or off in accordance with a scanning signal. The pixel electrode, which is a transparent electrode formed of ITO for example, is selectively supplied with an image signal via a data line. The tilt angle of the electro-optical material (for example, liquid crystal) sandwiched between an opposing electrode provided in the opposing substrate and the pixel electrode is controlled by an electric field generated between these electrodes on a pixel by pixel basis. In accordance with the change in tilt angle, the quantity of light passing through each pixel is controlled, and an image is displayed by an active matrix addressed electro-optical device such as a liquid crystal device.

The conducting layer is formed in a non-opening region separating an opening region of the pixel from that of another pixel. The conducting layer has a protruding portion protruding into the opening region from a part of one of a plurality of region edges defining the opening region. The term "opening region" of the invention substantially means a region through which light passes, for example, a region in which a pixel electrode is formed, and a region in which the gray scale of light coming out of an electro-optical material such as liquid crystal can be changed in accordance with the change in transmittance ratio. In other words, the term "opening region" means a region in which light collected to a pixel is not blocked by light-shielders such as interconnects, light-shielding films, and various elements that do not transmit light or have a transmittance ratio lower than that of a transparent electrode.

The term "non-opening region" in the invention means a region that does not transmit light contributing to display, for example, a region in which are disposed light-shielders such as opaque interconnects, electrodes, or various elements. The higher the opening ratio, which means the ratio of the opening region to the size of a pixel including the opening region and the non-opening region, the higher the display performance of an electro-optical device including the electro-optical device substrate according to the invention.

One of a plurality of region edges defining the opening region is defined, for example, by the edge of an interconnect or an electrode formed in the non-opening region. For example, in the case where the opening region is rectangular, the term "a plurality of region edges" means four sides defining the rectangular shape, and the plurality of region edges define the shape of the opening region. Each region edge does not have to extend linearly in a particular direction but can have a portion protruding or recessed in the direction perpendicular to the direction in which the region edge extends.

In the electro-optical device substrate according to the first aspect of the invention, since the protruding portion protrudes into the opening region, the area of the opening region is small compared to the case where the protruding portion is not provided. However, in the electro-optical device substrate according to the first aspect of the invention, since the protruding portion protrudes into the opening region from a part of one region edge, the non-opening region extending along the direction in which the one region edge extends can be narrowed except for the protruding portion. More specifically, since the first contact portion is electrically connected to the protruding portion as described hereinbelow, it is not necessary to secure a space for forming the first contact portion in the non-opening region extending on either side of the part of the one region edge. Therefore, for example, by narrowing a light-shielder such as a light-shielding interconnect on either side of the part of the one region edge, the width of the non-opening region can be reduced on either side of the protruding portion, and the area of the entire opening region can be increased.

Therefore, in the electro-optical device substrate according to the first aspect of the invention, since the protruding portion protrudes into the opening region, the shape of the opening region in plan view is not strictly rectangular. However, compared to the case where the protruding portion is not provided, the opening ratio can be improved, and the image quality of the electro-optical device including the electro-optical device substrate can be improved. In addition, even in the case where the non-opening region is narrowed, a margin necessary for the etching process for forming the first contact portion can be secured.

The first contact portion is a connector such as a contact hole electrically connecting the pixel electrode and the protruding portion. In the case where the conducting layer is electrically connected to an electrode constituting an element such as a hold capacitor, the hold capacitor can temporarily hold the potential of the pixel electrode in accordance with the image signal supplied to the pixel electrode. In this case, the conducting layer functions as a relay layer for electrical connection between the hold capacitor and the pixel electrode.

In the case where the electrode of the hold capacitor and the pixel electrode are electrically connected not via the conducting layer, the electrode of the hold capacitor has a large width for forming a contact portion for connecting the hold capacitor to the pixel electrode, and consequently the non-opening region also has a large width. However, in the invention, since the protruding portion protrudes from the nonopening region into the opening region, it is not necessary to extend the entire electrode of the hold capacitor into the opening region.

As described above, in the electro-optical device substrate according to the first aspect of the invention, the opening ratio can be improved with the electrical connection between the pixel electrode and the conducting layer secured. Therefore, the image quality of an electro-optical device such as a liquid crystal device including the electro-optical device substrate according to the invention can be improved.

In the first aspect of the invention, each pixel may further include a hold capacitor and a second contact portion. The hold capacitor includes a first electrode formed in the non-opening region, a second electrode formed over the first electrode in the non-opening region, and a dielectric film sandwiched by the first electrode and the second electrode, and temporarily holds a potential of the pixel electrode in accordance with an image signal supplied to the pixel electrode. The second contact portion electrically connects the conducting layer and the second electrode in the non-opening region.

In this case, since the conducting layer is electrically connected to the first contact portion and the second contact portion, the conducting layer functions as a relay layer for electrical connection between the hold capacitor and the pixel electrode.

In this case, the degree to which the opening region is narrowed is small compared to the case where the second electrode protruding into the opening region and the second contact portion are directly connected. More specifically, it is preferable to pattern the first electrode and the second electrode so that the area of the overlap between the first electrode and the second electrode is larger, and to thereby increase the capacity of the hold capacitor so as to improve the ability to hold the potential of the pixel electrode. However, to extend the second electrode into the opening region throughout the one region edge is not a preferable design from the viewpoint of improving the opening ratio. Therefore, by electrically connecting the pixel electrode and the hold capacitor via the conducting layer, the part of the second electrode protruding into the opening region can be reduced, and the decrease in the opening ratio can be prevented.

In the first aspect of the invention, each pixel may further include a hold capacitor and a second contact portion. The hold capacitor includes a first electrode formed in the non-opening region, a second electrode formed over the first electrode in the non-opening region, and a dielectric film sandwiched by the first electrode and the second electrode, and temporarily holds a potential of the pixel electrode in accordance with an image signal supplied to the pixel electrode. The second contact portion electrically connects the pixel electrode and the second electrode in the non-opening region.

In this case, the hold capacitor and the pixel electrode can be connected not via the conducting layer functioning as a relay layer.

In the first aspect of the invention, the first electrode and the second electrode may be metal films.

In this case, the hold capacitor has a so-called MIM (Metal-Insulator-Metal) structure. The second electrode is a pixel potential side capacitor electrode electrically connected to a data line, for example. The first electrode is a fixed potential side capacitor electrode at a fixed potential. Normally, the fixed potential side capacitor electrode extends across a plurality of pixels. Therefore, the area of the first electrode is larger than that of the second electrode. In the case where the first electrode and the second electrode are metal films, compared to the case where these electrodes are formed of a semiconductor, the power consumption of the entire electro-optical device substrate can be reduced. In addition, the elements in each pixel can operate at a high speed.

In a second aspect of the invention, an electro-optical device substrate includes a substrate, a plurality of data lines and a plurality of scanning lines crossing each other on the substrate, and a plurality of pixels defined by the plurality of data lines and the plurality of scanning lines so as to correspond to intersections thereof. Each pixel includes a pixel electrode, a conducting layer, a hold capacitor, a first contact portion, and a second contact portion. The conducting layer is formed in a non-opening region separating an opening region of the pixel from that of another pixel. The conducting layer has a protruding portion protruding into the opening region from a part of one of a plurality of region edges defining the opening region. The hold capacitor includes a first electrode extending from the non-opening region into the opening region, a second electrode formed over the first electrode, and a dielectric film sandwiched by the first electrode and the second electrode. The hold capacitor temporarily holds a potential of the pixel electrode in accordance with an image signal supplied to the pixel electrode. The first contact portion electrically connects the conducting layer and the pixel electrode in the non-opening region. The second contact portion electrically connects the protruding portion and the first electrode.

As with the above-described electro-optical device substrate, the electro-optical device substrate according to the second aspect of the invention includes a conducting layer having a protruding portion protruding into the opening region from a part of one of a plurality of region edges defining the opening region, and a hold capacitor.

Since the first contact portion electrically connects the conducting layer and the pixel electrode in the non-opening region, it does not narrow the opening region.

The hold capacitor has a first electrode extending from the non-opening region into the opening region. The protruding portion and the first electrode are electrically connected by the second contact portion. The protruding portion protrudes into the opening region from a part of one of a plurality of region edges defining the opening region. The first electrode also extends into the opening region from the part of the one region edge. Therefore, it is only necessary to extend the part of the first electrode connected to the second contact portion into the opening region. Unlike in the case where the entire first electrode is extended into the opening region, the decrease in opening ratio is small. In addition, as with the electro-optical device substrate according to the first aspect of the invention, it is possible to narrow the parts of the non-opening region extending on either side of the second contact portion along the direction in which the one region edge extends, and therefore the opening ratio can be increased.

In the case of the electro-optical device substrate according to the second aspect of the invention, the opening ratio can be improved, with the electrical connection between the pixel electrode, the conducting layer, and the hold capacitor secured. Therefore, it is possible to improve the image quality of an electro-optical device such as a liquid crystal device including the electro-optical device substrate according to the second aspect of the invention.

In the second aspect of the invention, the first electrode may be a semiconductor layer having a first portion that extends into the opening region from the non-opening region and that is not located under the second electrode, and the second contact portion may be electrically connected to the first portion.

In this case, the hold capacitor has a so-called MIS (Metal-Insulator-Semiconductor) structure. For example, an image signal is supplied to the pixel electrode via the first electrode electrically connected to the drain of a TFT formed in the non-opening region.

In the first aspect of the invention, the one region edge may extend along the direction in which the scanning lines extend, and the protruding portion may protrude into the opening region from the center of the one region edge.

In this case, the deterioration in image quality caused by an asymmetrical shape in plan view of the opening region in each pixel can be prevented.

In the first aspect of the invention, the one region edge may extend along the direction in which the scanning lines extend, and the protruding portion may protrude into the opening region from a position off the center of the one region edge.

In this case, if the protruding portion cannot be protruded into the opening region from the center of the one region edge due to the layout of interconnects or elements formed in the non-opening region, the conducting layer and the pixel electrode can be electrically connected by protruding the protruding portion into the opening region from a position off the center of the one region edge.

In the first aspect of the invention, the protruding portion may protrude into the opening region from a corner of the opening region.

In this case, the protruding portion protrudes into the opening region from a place where one region edge and another region edge meet, and interconnects and various elements in the non-opening region can be disposed more flexibly.

In the first aspect of the invention, each pixel may further include a transistor whose source is electrically connected to one of the data lines and whose gate is electrically connected to one of the scanning lines, and the hold capacitor may be disposed directly above the transistor.

In this case, light incident on the transistor can be blocked by the hold capacitor. The term "directly above" means that the hold capacitor is disposed just above the transistor and there is no light-shielding film therebetween. In this case, since the hold capacitor is disposed directly above the transistor, the hold capacitor can block light incident at a large angle with respect to the normal direction to the semiconductor layer of the transistor, and can reduce the light leak current generated in the transistor.

In the first aspect of the invention, the conducting layer may be formed in the same layer as the data lines.

In this case, the data lines and the conducting layers can be formed so as to be apart from each other in the following way. First, a thin film of a conducting material is formed in the layer in which the data lines are provided, using a thin film formation technology. Next, the thin film is partly removed. In this case, since the data lines and the conducting layers can be formed in the same process, the manufacturing process can be simplified.

An electro-optical device according to a third aspect of the invention includes the electro-optical device substrate according to the first aspect of the invention.

Since the electro-optical device according to the third aspect of the invention includes the electro-optical device substrate according to the first aspect of the invention, the electro-optical device has high display performance.

An electronic apparatus according to a fourth aspect of the invention includes the electro-optical device according to the third aspect of the invention.

Since the electronic apparatus according to the fourth aspect of the invention includes the electro-optical device according to the third aspect of the invention, it is possible to realize various electronic apparatuses, such as a projection display apparatus, a cellular phone, a personal digital assistance, a word processor, a viewfinder-type or monitor-direct-view-type video tape recorder, a workstation, a video phone, a POS terminal, and a touch panel, that are capable of high-quality display. In addition, an electrophoretic apparatus such as an electronic paper can also be realized.

The above-described advantage of the invention will become apparent from the following description of exemplary embodiments.

BRIEF DESCRIPTION OF THE DRAWINGS

The invention will be described with reference to the accompanying drawings, wherein like numbers reference like elements.

DESCRIPTION OF EXEMPLARY EMBODIMENTS

The exemplary embodiments of an electro-optical device substrate, an electro-optical device, and an electronic apparatus according to some aspects of the invention will now be described with reference to the drawings.

First Exemplary Embodiment 1-1: Overall Structure of Electro-Optical Device

Figure 1:
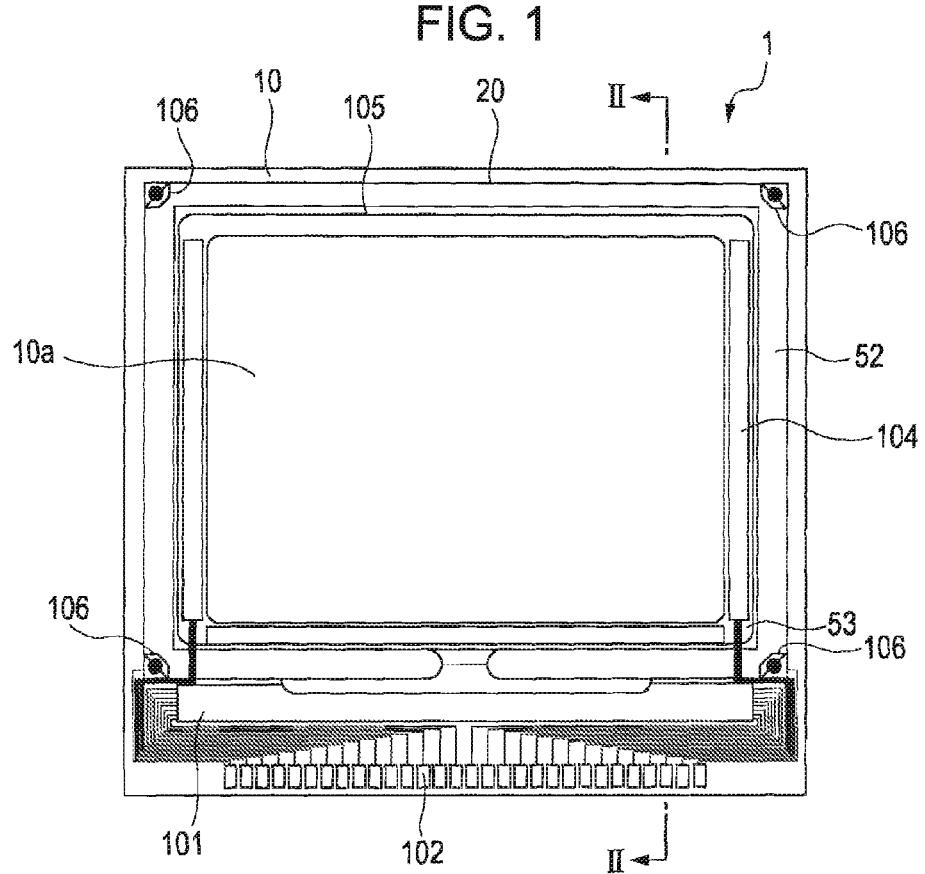
FIG. 1 is a plan view of an electro-optical device according to a first exemplary embodiment and shows a TFT array substrate and components formed thereon viewed through an opposing substrate.
Figure 2:
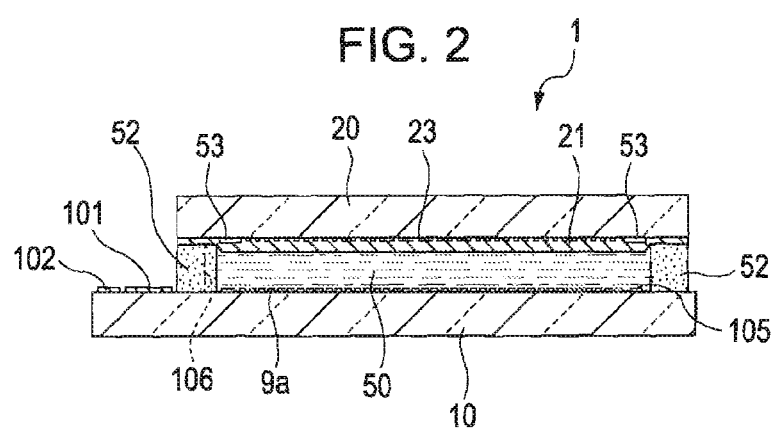
FIG. 2 is a sectional view taken along line II-II of FIG. 1.

First, exemplary embodiments of an electro-optical device substrate and an electro-optical device having the same according to the first aspect of the invention will be described with reference to FIGS. 1 and 2. FIG. 1 is a plan view of an electro-optical device and shows a TFT array substrate and components formed thereon viewed through an opposing substrate. FIG. 2 is a sectional view taken along line II-II of FIG. 1. In this exemplary embodiment, a TFT active matrix liquid crystal device having a built-in drive circuit is taken as an example of an electro-optical device.

In FIGS. 1 and 2, in a liquid crystal device 1, a TFT array substrate 10 and an opposing substrate 20 are disposed opposite each other. A liquid crystal layer 50 is disposed between the TFT array substrate 10 and the opposing substrate 20. The TFT array substrate 10 and the opposing substrate 20 are bonded to each other with a seal 52. The seal 52 is provided in a seal region around an image display region 10a. The image display region 10a is a pixel region in which a plurality of pixels are provided.

The seal 52 is, for example, an ultraviolet setting resin or a thermosetting resin for bonding both substrates together. In the manufacturing process, the seal 52 is applied on the TFT array substrate 10 and is then set by ultraviolet irradiation or heating. Gap materials such as glass fibers or glass beads are dispersed in the seal 52 in order to make the distance between the TFT array substrate 10 and the opposing substrate 20 (intersubstrate gap) a predetermined value. The liquid crystal device 1 of this exemplary embodiment is suitable as a small light valve for a projector performing enlarged display.

The opposing substrate 20 is provided with a picture frame light-shielding film 53. The picture frame light-shielding film 53 is provided along the inner side of the seal region in which the seal 52 is disposed. The picture frame light-shielding film 53 defines a picture frame region for the image display region 10a. Instead of part or all of such a picture frame light-shielding film 53, a built-in light-shielding film may be provided on the TFT array substrate 10. The liquid crystal device 1 has a peripheral region around the image display region 10a.

In this exemplary embodiment, a region more distant than the picture frame light-shielding film 53 from the center of the TFT array substrate 10 is defined as a peripheral region.

In a part of the peripheral region located outside the seal region in which the seal 52 is disposed, a data line driving circuit 101 and external circuit connecting terminals 102 are provided along one side of the TFT array substrate 10. In addition, scanning line driving circuits 104 are provided along two sides adjacent to the one side so as to be covered by the picture frame light-shielding film 53. In addition, in order to connect the two scanning line driving circuits 104 provided on either side of the image display region 10a, a plurality of interconnects 105 are provided along the other one side of the TFT array substrate 10 so as to be covered by the picture frame light-shielding film 53.

The opposing substrate 20 has vertical conducting members 106 disposed in the four corners thereof. The vertical conducting members 106 function as vertical conducting terminals between both substrates. On the other hand, the TFT array substrate 10 has vertical conducting terminals provided in regions opposite these corners. The vertical conducting members 106 and the vertical conducting terminals establish electrical conduction between the TFT array substrate 10 and the opposing substrate 20.

In FIG. 2, an alignment layer is formed on the TFT array substrate 10, or more specifically on pixel electrodes 9a after TFTs for pixel switching and interconnects such as scanning lines and data lines are formed. On the other hand, on the opposing substrate 20, in addition to an opposing electrode 21, a lattice-like light-shielding film 23 or stripe-like shielding films are provided. In addition, the opposing substrate 20 has an alignment layer formed on the most liquid crystal layer 50 side thereof. The liquid crystal layer 50 is formed of, for example, one type of nematic liquid crystal or a mixture of several types of nematic liquid crystal. The liquid crystal layer 50 is in a predetermined alignment state between the pair of alignment layers.

The TFT array substrate 10 is a transparent substrate, for example, a quartz substrate, a glass substrate, or a silicon substrate. The opposing substrate 20 is also a transparent substrate as with the TFT array substrate 10.

The TFT array substrate 10 is provided with pixel electrodes 9a. Over the pixel electrodes 9a is provided an alignment film treated using a predetermined method such as rubbing. The pixel electrodes 9a are transparent conducting layers formed of ITO (Indium Tin Oxide), for example. The alignment layer is an organic film formed of polyimide, for example.

On the entire surface of the opposing substrate 20 is provided an opposing electrode 21. Under the opposing electrode 21 is provided an alignment layer 22 treated using a predetermined method such as rubbing. The opposing electrode 21 is a transparent conducting layer formed of ITO, for example. The alignment layer 22 is an organic film formed of polyimide, for example.

The opposing substrate 20 may be provided with a lattice-like light-shielding film or stripe-like light-shielding films. By adopting such a configuration in addition to upper light-shielding films provided as upper capacitor electrodes 300, incident light from the TFT array substrate 10 side can be more surely prevented from entering channel regions 1a' and their vicinities.

A liquid crystal layer 50 is formed between the TFT array substrate 10 and the opposing substrate 20 configured as above and disposed so that the pixel electrodes 9a and the opposing electrode 21 face each other. When no electrical field is applied from the pixel electrodes 9a to the liquid crystal layer 50, the liquid crystal molecules in the liquid crystal layer 50 are aligned in a predetermined state by the alignment layers.

On the TFT array substrate 10 shown in FIGS. 1 and 2, in addition to the driving circuits such as the data line driving circuit 101 and the scanning line driving circuits 104, a sampling circuit, a precharging circuit, an inspection circuit, and so forth may be formed. The sampling circuit samples image signals on image signal lines and supplies the image signals to the data lines. The precharging circuit supplies the plurality of data lines with precharging signals at a predetermined voltage level before the supply of image signals. The inspection circuit inspects the quality, defects, and so forth of the electro-optical device during manufacture or before shipping.

1-2: Electrical Connection Configuration of Pixels

Figure 3:
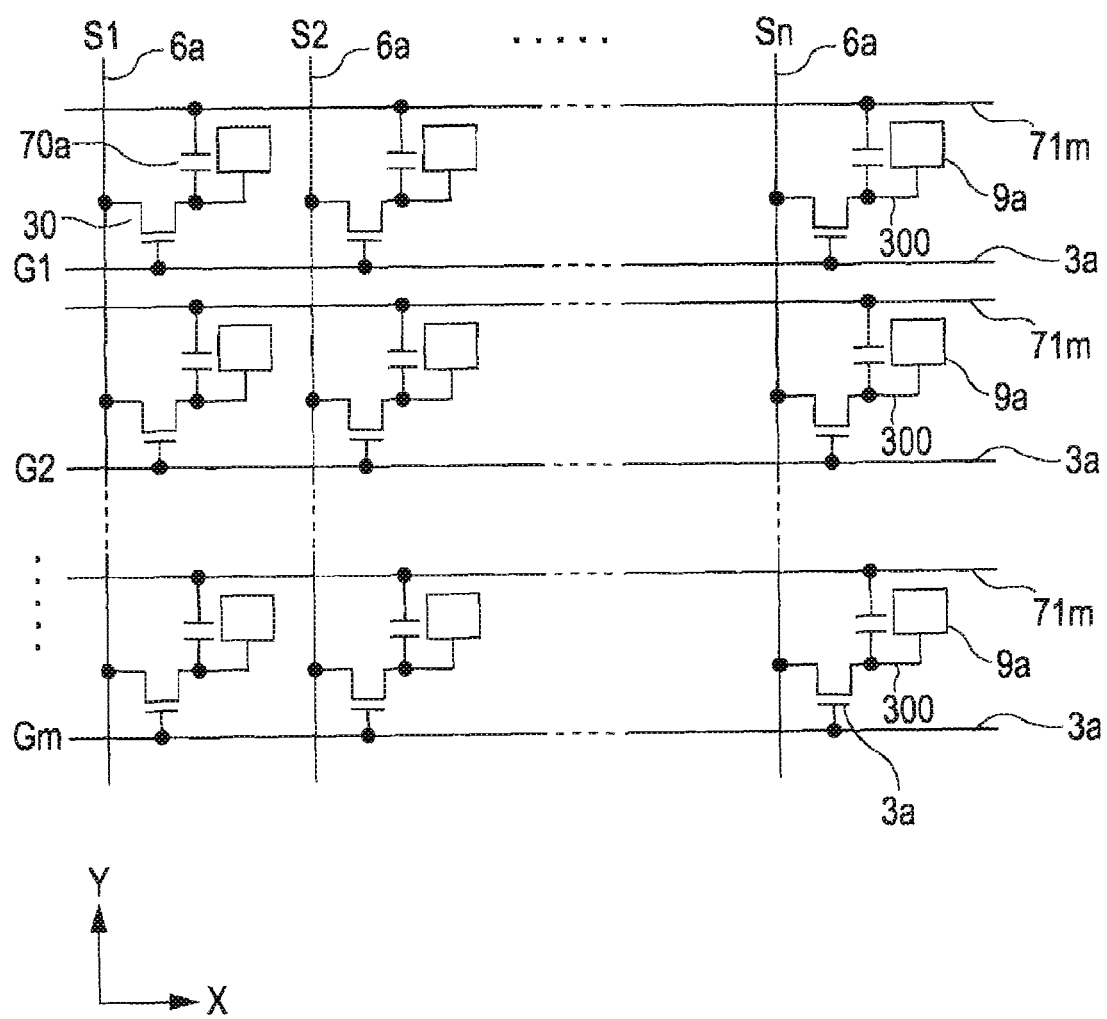
FIG. 3 shows an equivalent circuit of various elements, interconnects, and so forth in a plurality of pixels of the electro-optical device according to the first exemplary embodiment of the invention.

Next, the electrical connection configuration of pixels of the liquid crystal device 1 will now be described in detail with reference to FIG. 3. FIG. 3 shows an equivalent circuit of various elements, interconnects, and so forth in a plurality of pixels that are formed in a matrix and that constitute the image display region of the liquid crystal device 1.

In FIG. 3, each of the plurality of pixels, which are arranged in a matrix and constitute the image display region 10a of the liquid crystal device 1, has a pixel electrode 9a and a TFT 30. The TFT 30 is electrically connected to the pixel electrode 9a, and switches the pixel electrode 9a when the liquid crystal device 1 is in operation. The source of the TFT 30 is electrically connected to a data line 6a to which an image signal is supplied. Image signals S1, S2, . . . , Sn to be written into the data lines 6a may be supplied in this order one line at a time, or may be supplied one group at a time to a plurality of data lines 6a adjacent to each other.

The gate of the TFT 30 is electrically connected to a scanning line 3a. The liquid crystal device 1 is configured so that scanning signals G1, G2, . . . , Gm are applied to the scanning lines 3a at a predetermined timing, in pulses, and in this order one line at a time. The drain of the TFT 30 is electrically connected to the pixel electrode 9a. The TFT 30, which acts as a switching element, is closed for a certain period of time. Thus, the image signals S1, S2, . . . , Sn supplied from the data lines a are written at a predetermined timing. The image signals S1, S2, . . . , Sn at predetermined levels written into the liquid crystal via the pixel electrodes 9a are held between the pixel electrodes 9a and the opposing electrode formed on the opposing substrate for a certain period of time.

The alignment and order of molecular groups of the liquid crystal forming the liquid crystal layer 50 are changed in accordance with the applied voltage level. Thus, the liquid crystal modulates light, thereby making the gray-scale display possible. In the normally white mode, the transmittance ratio for incident light is decreased in accordance with the voltage applied to each pixel. In the normally black mode, the transmittance ratio for incident light is increased in accordance with the voltage applied to each pixel. On the whole, the liquid crystal device 1 emits light having a contrast according to the image signals. In order to prevent the held image signals from leaking, storage capacitors 70a are electrically connected in parallel with liquid crystal capacitors formed between the pixel electrodes 9a and the opposing electrode. Due to these, the potential holding property in the pixel electrodes 9a is improved, and display with high contrast and reduced flicker is achieved.

1-3: Specific Configuration of Pixels

Figure 4:
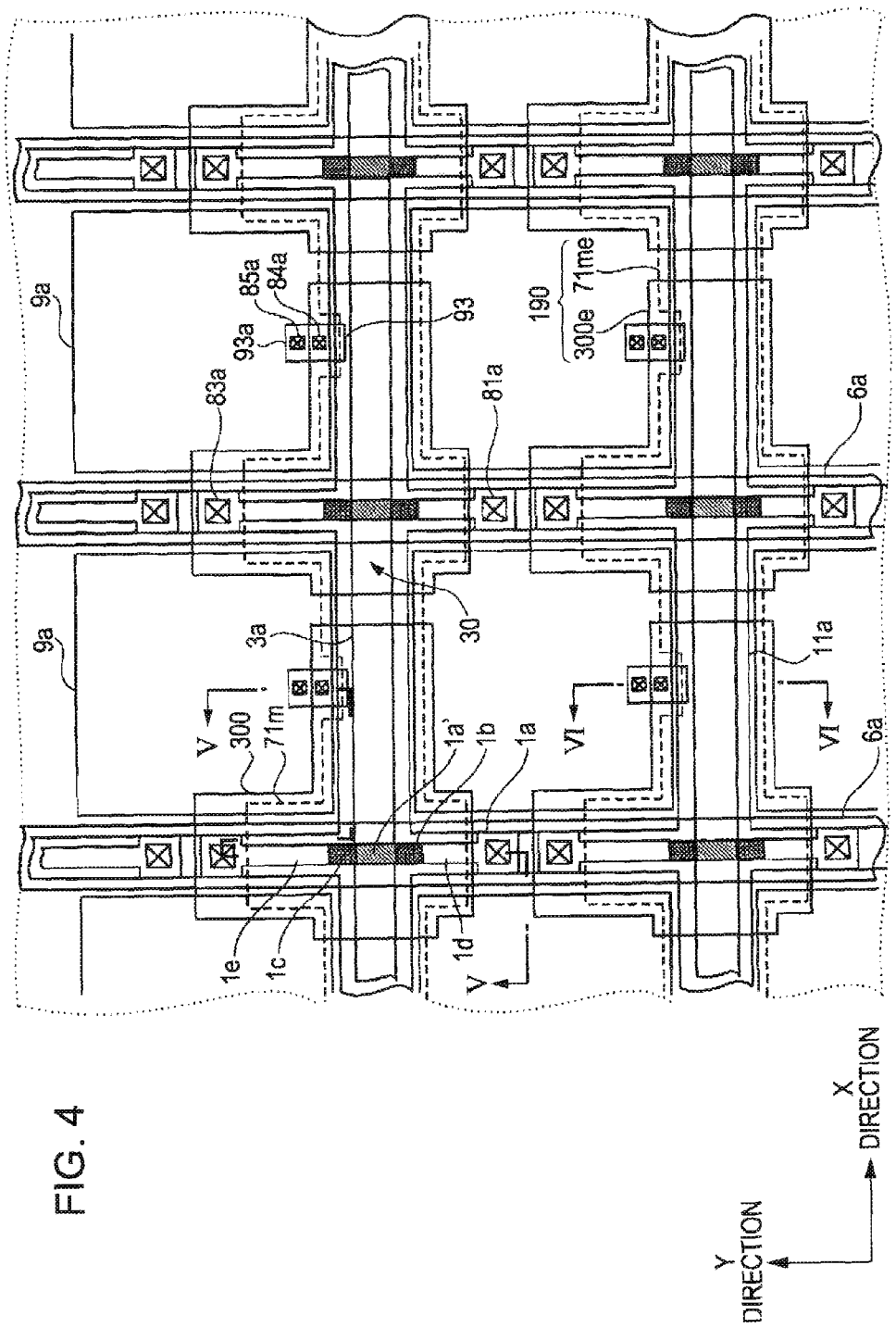
FIG. 4 is a plan view of a plurality of pixels adjacent to each other on a TFT array substrate, on which data lines, scanning lines, pixel electrodes, and so forth are formed, of the electro-optical device according to the first exemplary embodiment of the invention.
Figure 5:
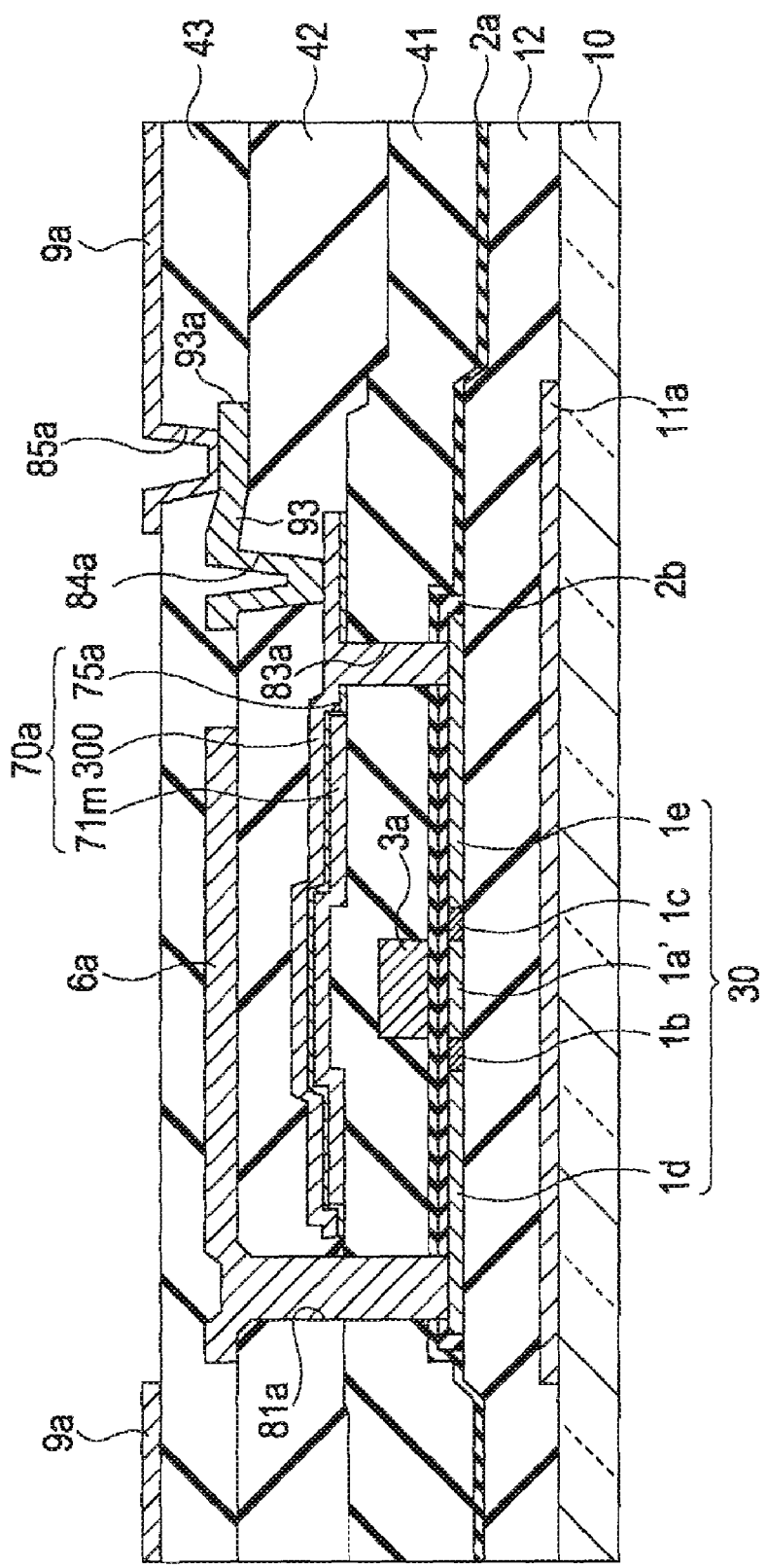
FIG. 5 is a sectional view taken along line V-V of FIG. 4.
Figure 6:
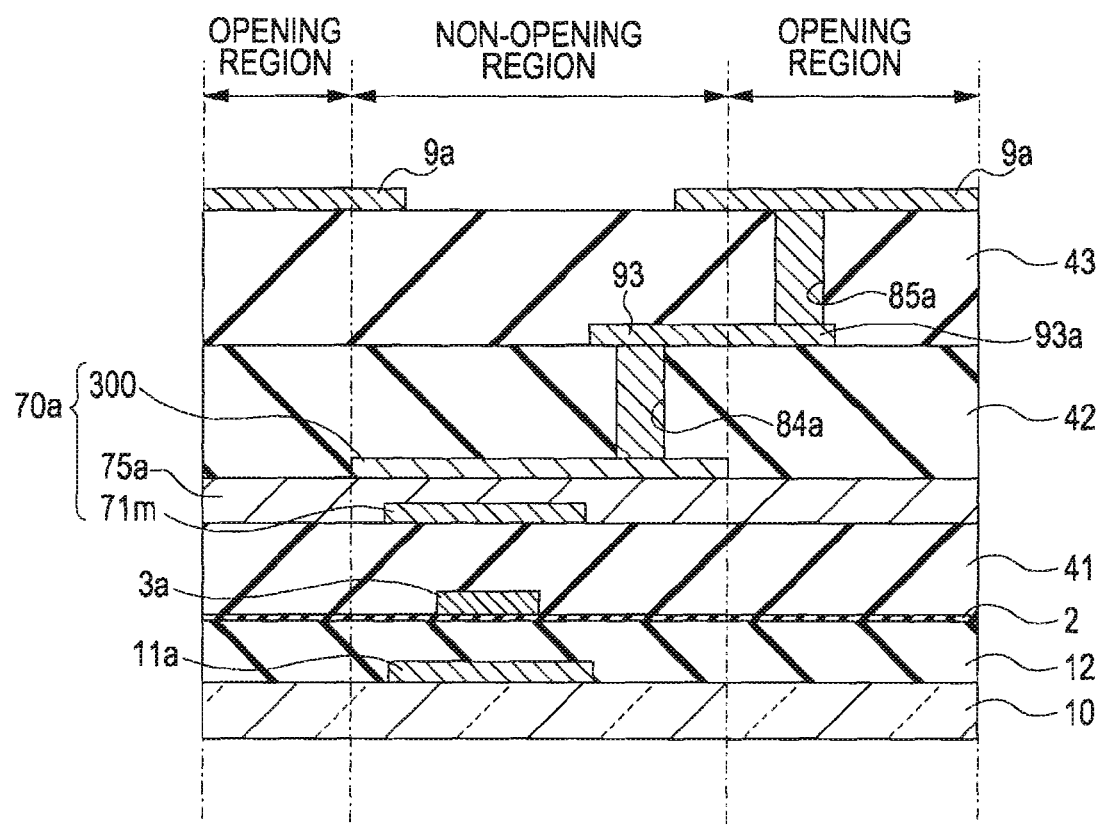
FIG. 6 is a sectional view taken along line VI-VI of FIG. 4.

Next, the specific configuration of the pixels will be described with reference to FIGS. 4 to 6. FIG. 4 is a plan view of a plurality of pixels adjacent to each other on a TFT array substrate on which data lines, scanning lines, pixel electrodes, and so forth are formed. FIG. 5 is a sectional view taken along line V-V of FIG. 4. FIG. 6 is a sectional view taken along line VI-VI of FIG. 4. In FIGS. 4 to 6, each layer or each member is show in a different scale so that each layer or each member can have a sufficiently understandable size. In addition, in FIGS. 5 and 6, for convenience of explanation, the part located above the pixel electrodes 9a is not shown.

In FIGS. 4 and 5, on the TFT array substrate 10 of the liquid crystal device 1, a plurality of transparent pixel electrodes 9a are provided in the X and Y directions in the figures, in a matrix. Along the vertical and horizontal boundaries between the pixel electrodes 9a, a plurality of data lines 6a and a plurality of scanning lines 3a are provided.

The scanning lines 3a are disposed so as to face channel regions 1a', which are the right hatched regions in FIG. 4, of the semiconductor layers 1a. TFTs 3u for pixel switching are provided at intersections of the scanning lines 3a with the data lines 6a.

The data lines 6a are formed on a second interlayer insulating film 42 shown in FIG. 5. The upper surface of the second interlayer insulating film 42 is planarized. The data lines 6a are electrically connected to heavily-doped source regions 1d of the TFTs 30 included in the semiconductor layers 1a via contact holes 81a. The data lines 6a and the insides of the contact holes 81 are formed of a material including aluminum-silicon-copper (Al—Si—Cu) alloy or an aluminum-copper (Al—Cu) alloy, elemental aluminum, or a multilayer film of an aluminum layer, a titanium nitride layer, and so forth. The data lines 6a also have a function to shield the TFTs 30 from light.

The storage capacitors 70 each include a lower capacitor electrode 71m and an upper capacitor electrode 300 disposed so as to face each other with a dielectric film 75a interposed therebetween.

The upper capacitor electrode 300 is a pixel potential side capacitor electrode electrically connected to a heavily-doped drain region 1e of a corresponding TFT 30 and a corresponding pixel electrode 9a. More specifically, the upper capacitor electrode 300 is electrically connected to a corresponding relay layer 93 via a corresponding contact hole 84a. The upper capacitor electrode 300 and the relay layer 93 function as relays for electrical connection between the heavily-doped drain region 1e and the pixel electrode 9a.

The upper capacitor electrode 300 is, for example, a metal film including a metal or an alloy and provided above the TFT 30. The upper capacitor electrode 300 also functions as an upper light-shielding film (built-in light-shielding Film) shielding the TFT 30. The upper capacitor electrode 300 includes metals, for example, aluminum, silver, and so forth. The upper capacitor electrode 300 may also be formed of an elemental metal, an alloy, a metal silicide, a polysilicide, or a laminated structure of these including at least one of high melting point metals, for example, titanium, chromium, tungsten, tantalum, molybdenum, palladium, and so forth.

The lower capacitor electrode 71m extends from the image display region 10a in which pixel electrodes 9a are disposed, to the periphery thereof. The lower capacitor electrode 71m is a fixed potential side capacitor electrode electrically connected to a fixed potential source and maintained at a fixed potential.

The lower capacitor electrode 71m is also a metal film as with the upper capacitor electrode 300. Therefore, the storage capacitor 70a is configured to have a three-layer structure of a metal film, a dielectric film, and a metal film, or a so-called MIM (Metal-Insulator-Metal) structure. The lower capacitor electrode 71m extends across a plurality of pixels and is shared by the plurality of pixels. In this exemplary embodiment, since the lower capacitor electrode 71m is a metal film, compared to the case where the lower capacitor electrode 71m is formed of a semiconductor, the power consumption in the entire liquid crystal device 1 when the liquid crystal device 1 is driven is low, and elements in each pixel can be operated at a high speed.

The dielectric film 75a is, for example, a silicon oxide film such as an HTO (High Temperature Oxide) film or an LTO (Low Temperature Oxide) film, or a silicon nitride film.

The lower light-shielding film 11a provided in a lattice shape under the TFTs 30 with a base insulating film 12 interposed therebetween shields the channel regions 1a' of the TFTs 30 and their vicinities from the return light entering the device from the TFT array substrate 10 side. As with the upper capacitor electrode 300 and the lower capacitor electrode 71m, the lower light-shielding film 11a is formed of an elemental metal, an alloy, a metal silicide, a polysilicide, or a laminated structure of these including at least one of high melting point metals, for example, titanium, chromium, tungsten, tantalum, molybdenum, palladium, and so forth.

The base insulating film 12 has a function to insulate the TFTs 30 from the lower light-shielding film 11a. In addition, being formed on the entire surface of the TFT array substrate 10, the base insulating film 12 has a function to prevent deterioration in characteristics of the pixel switching TFTs 30 due to roughening of the surface of the TFT array substrate 10 during polishing or dirt remaining after cleaning.

Each pixel electrode 9a is electrically connected to a corresponding heavily-doped drain region 1e in a semiconductor layer 1a via corresponding upper capacitor electrode 300, contact holes 83a, 84a, and 85a, and relay layer 93. The contact holes 85a are through holes formed in a third interlayer insulating layer 43, and their inner walls are coated with the same conducting material as the pixel electrodes 9a, for example, ITO.

In FIG. 5, the TFT 30 has a channel region 1a' of a semiconductor layer 1a, and a gate insulating film 2. In the channel region 1a', a channel is formed due to the electric field from the scanning line 3a shared as a gate electrode. The gate insulating film 2 includes two insulating films 2a and 2b that insulate the scanning line 3a from the semiconductor layer 1a. The semiconductor layer 1a has an LDD (Lightly Doped Drain) structure having a lightly-doped source region 1b, a lightly-doped drain region 1c, a heavily-doped source region 1d, and a heavily-doped drain region 1e. The lightly-doped source region 1b, the lightly-doped drain region 1c, the heavily-doped source region 1d, and the heavily-doped drain region 1e constitute doped regions of the semiconductor layer 1a, and are formed on either side of the channel region 1a' in mirror symmetry.

The storage capacitor 70a is disposed directly above the TFT 30 with the first interlayer insulating film 41 interposed therebetween. Therefore, the storage capacitor 70a can block light incident on the semiconductor layer 1a of the TFT 30 from the normal direction to the semiconductor layer 1a, along the direction in which the semiconductor layer 1a extends, at a large angle with respect to the normal direction, and can reduce the light leak current generated in the semiconductor layer 1a. Therefore, the OFF-state current that flows through the lightly-doped source region 1b and the lightly-doped drain region 1c when the TFT 30 is not in operation can be reduced, and the degradation of the ON-state current that flows when the TFT 30 is in operation can be prevented. Therefore, the liquid crystal device 1 can display a high-quality image when it is in operation.

On the scanning lines 3a is formed a first interlayer insulating film 41. The first interlayer insulating film 41 has contact holes 81a and contact holes 83a formed therein. Each contact hole 81a leads to a corresponding heavily-doped source region 1d. Each contact hole 83a leads to a corresponding heavily-doped drain region 1e. On the first interlayer insulating film 41 are formed lower capacitor electrodes 71m and upper capacitor electrodes 300. On these is formed a second interlayer insulating film 42, which has contact holes 81a formed therein. A third interlayer insulating film 43 is formed so as to cover the entire surface of the second interlayer insulating film 42 as well as the data lines 6a and the relay layers 93 thereon. The third interlayer insulating film 43 has contact holes 85a formed therein. The pixel electrodes 9a and the alignment layer (not shown) are provided on the upper surface of the third interlayer insulating film 43.

The relay layers 93 are formed in the same layer as the data lines 6a on the second interlayer insulating film 42. The data lines 6a and the relay layers 93 are formed so as to be apart from each other in the following way. First, a thin film of a conductive material, for example, a metal film is formed on the second interlayer insulating film 42 using a thin film formation technology. Next, the thin film is partly removed, that is to say, a patterning is performed. Therefore, since the data lines 6a and the relay layers 93 can be formed in the same process, the manufacturing process of the liquid crystal device 1 can be simplified.

In FIG. 4, the scanning lines 3a, the data lines 6a, the storage capacitors 70a, the lower light-shielding film 11a, the relay layers 93, and the TFTs 30 are disposed in non-opening regions surrounding an opening region of each pixel on the TFT array substrate 10. The opening regions correspond to the pixel electrodes 9a in plan view. That is to say, in each pixel, the opening region is a region that transmits or reflects light contributing to display. That is to say, the scanning lines 3a, the storage capacitors 70a, the data lines 6a, the lower light-shielding film 11a, and the TFTs 30 are disposed not in the opening region of each pixel but in the non-opening regions so as not to interfere with the display.

Next, the arrangement of the relay layers 93 will be described in detail with reference to FIGS. 4 and 6.

In FIG. 4, the opening regions have a substantially rectangular shape in plan view. In each pixel, the opening region is defined by the edges of the upper capacitor electrodes 300, the lower capacitor electrodes 71m, and the lower light-shielding film 11a. For example, a region edge 190, which is one of four region edges defining one opening region, is defined by an edge 300e of an upper capacitor electrode 300 extending in the X direction and an edge 71me of a lower capacitor electrode 71m extending in the X direction. Each relay layer 93 has a protruding portion 93a protruding into a corresponding opening region from a corresponding non-opening region. The protruding portion 93a protrudes into the opening region from the center of a corresponding region edge 190.

Since the protruding portion 93a protrudes into the opening region, the area of the opening region is small compared to the case where the protruding portion 93a is not provided. However, in this exemplary embodiment, since the protruding portion 93a protrudes into the opening region from a part of the region edge 190 (for example, the center of the region edge 190), the non-opening region extending along the X direction can be narrowed except for the protruding portion 93a. More specifically, since each contact hole 85a is electrically connected to a corresponding protruding portion 93a as described hereinbelow, it is not necessary to secure a space for forming the contact hole 85a in the non-opening region extending on either side of the center of the region edge 190. Therefore, light-shielders such as an interconnect formed in the non-opening region can be narrowed on either side of the center of the region edge 190. Therefore, the width of the non-opening region can be reduced on either side of the protruding portion 93a, and the area of the entire opening region can be increased.

Since the protruding portion 93a protrudes into the opening region, the shape of the opening region in plan view is not strictly rectangular. However, compared to the case where the protruding portion 93a is not provided, the opening ratio can be improved, and the image quality of the liquid crystal device 1 can be improved. In addition, even in the case where the non-opening region is narrowed, it is possible to secure a margin necessary for the removal process such as etching performed when the third interlayer insulating film 43 is partly removed so as to form the contact holes 85a.

In this exemplary embodiment, since the protruding portion 93a protrudes into the opening region from the center of the region edge 190, it is possible to prevent the deterioration in image quality caused by an asymmetrical shape in plan view of the opening region in each pixel.

Next, with reference to FIG. 6, the electrical connection structure between the pixel electrode 9a and the upper capacitor electrode 300 will be described in detail.

in FIG. 6, the contact hole 85a is an example of a connector electrically connecting the pixel electrode 9a and the protruding portion 93a. The protruding portion 93a is a part of the relay layer 93 and protrudes into the opening region from the non-opening region In the non-opening region, the relay layer 93 is electrically connected to the upper capacitor electrode 300 via the contact hole 84a. Therefore, the storage capacitor 70a is electrically connected to the pixel electrode 9a. The storage capacitor 70a can temporarily maintain the potential of the pixel electrode 9a in accordance with an image signal supplied to the pixel electrode 9a.

In the case where the upper capacitor electrode 300 and the pixel electrode 9a are electrically connected not via the relay layer 93, the upper capacitor electrode 300 overlaps with the pixel electrode 9a so as to narrow the opening region. More specifically, the overlap between the upper capacitor electrode 300 and the pixel electrode 9a is large so that a space for forming a contact portion electrically connecting the upper capacitor electrode 300 and the pixel electrode 9a can be secured. When such an overlap is large, the width of the non-opening region defined by the edge of the upper capacitor electrode 300 is also large, and consequently the opening region is narrow. In this exemplary embodiment, since the upper capacitor electrode 300 and the pixel electrode 9a are electrically connected via the protruding portion 93a, as described above, the decrease of the opening region can be minimized. In other words, the opening region can be increased.

In addition, in the case where the contact hole 84a is used, the degree to which the opening region is narrowed is small compared to the case where the upper capacitor electrode 300 protruding Into the opening region and the contact hole 85a formed so as to penetrate the second interlayer insulating film 42 are directly connected. More specifically, it is preferable to pattern the upper capacitor electrode 300 and the lower capacitor electrode 71m so that the area of the overlap between the upper capacitor electrode 300 and the lower capacitor electrode 71m is larger, and to thereby increase the capacity of the storage capacitor 70a so as to improve the ability to hold the potential of the pixel electrode 9a. However, to extend the upper capacitor electrode 300 into the opening region throughout the region edge 190 is not a preferable design from the viewpoint of improving the opening ratio. Therefore, by electrically connecting the pixel electrode 9a and the storage capacitor 70a via the relay layer 93, the part of the upper capacitor electrode 30n protruding into the opening region can be reduced, and the decrease in the opening ratio can be prevented.

As described above, the electro-optical device substrate according to this exemplary embodiment can improve the opening ratio, with the electrical connection between the pixel electrode 9a and the storage capacitor 70a secured. Therefore, the liquid crystal device 1 according to this exemplary embodiment can display a high-quality image.

First Modification

Figure 7:
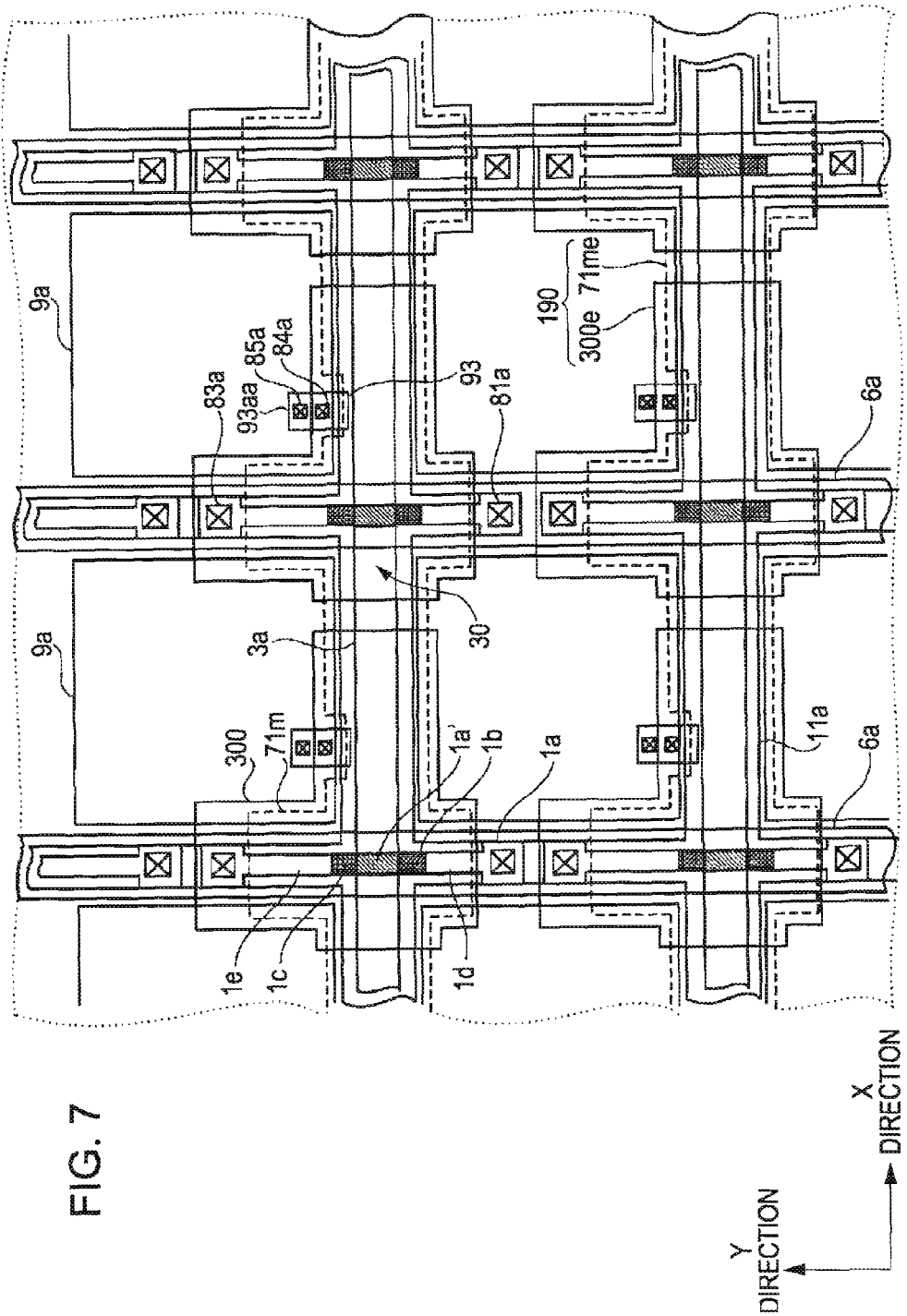
FIG. 7 is a plan view showing a first modification of a plurality of pixels adjacent to each other of a TFT array substrate in the first exemplary embodiment of the invention.

Next, a modification of the relay layer 93 in each pixel will be described with reference to FIG. 7. FIG. 7 is a plan view showing a modification of a plurality of pixels adjacent to each other of a TFT array substrate on which data lines, scanning lines, pixel electrodes, and so forth are formed. In the following description, the same reference numeral will be used to designate the same components as those of the above-described liquid crystal device 1, so that the detailed description will be omitted.

In FIG. 7, in the liquid crystal device of this modification, each relay layer 93 has a protruding portion 93aa protruding into a corresponding opening region from a corresponding region edge 190. The protruding portion 93aa is located off the center of the region edge 190 in the X direction. If a part of the relay layer 93 cannot be protruded into the opening region from the center of one region edge due to the layout of interconnects and elements such as a storage capacitor 70a formed in the non-opening region, the relay layer 93 and the pixel electrode 9a can be electrically connected via the protruding portion 93aa.

Second Modification

Figure 8:
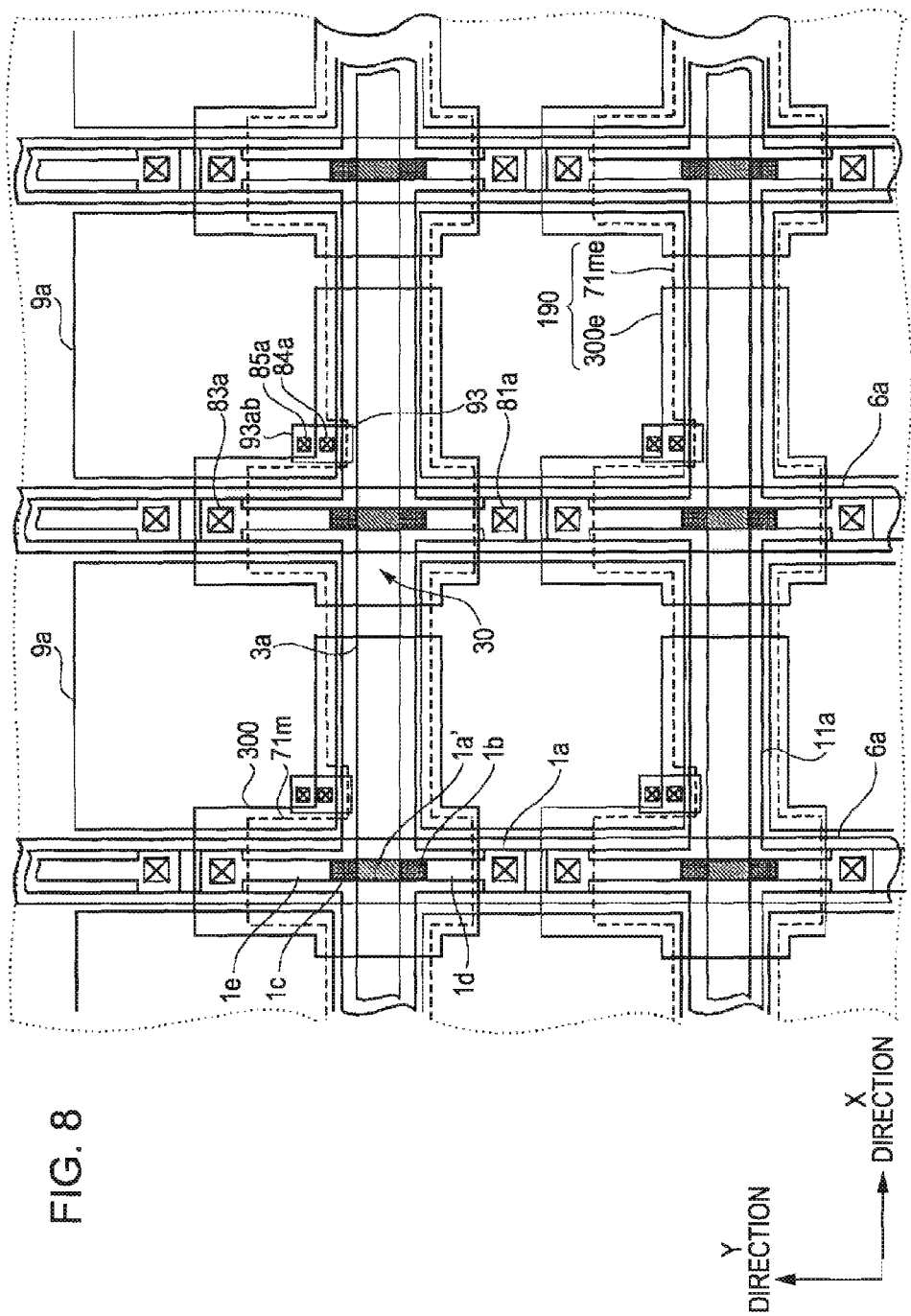
FIG. 8 is a plan view showing a second modification of a plurality of pixels adjacent to each other of a TFT array substrate in the first exemplary embodiment of the invention.

Next, another modification of the relay layer 93 in each pixel will be described with reference to FIG. 8. FIG. 8 is a plan view showing a modification of a plurality of pixels adjacent to each other of a TFT array substrate 10 on which data lines 6a, scanning lines 3a, pixel electrodes 9a, and so forth are formed.

In FIG. 8, the protruding portion 93ab protruding into the opening region from the relay layer 93 protrudes into the opening region from a corner of the opening region having a substantially rectangular shape. More specifically, the protruding portion 93ab protrudes into the opening region from a place where one region edge 190 and another region edge meet (that is to say, a corner of the opening region). Therefore, the protruding portion 93ab does not have to protrude into the opening region from the center or a position off the center of the region edge 190 but can be disposed in accordance with the arrangement of interconnects and various elements such as a storage capacitor in the non-opening region. Therefore, interconnects and various elements such as a storage capacitor in the non-opening region can be disposed more flexibly.

Second Exemplary Embodiment

Figure 9:
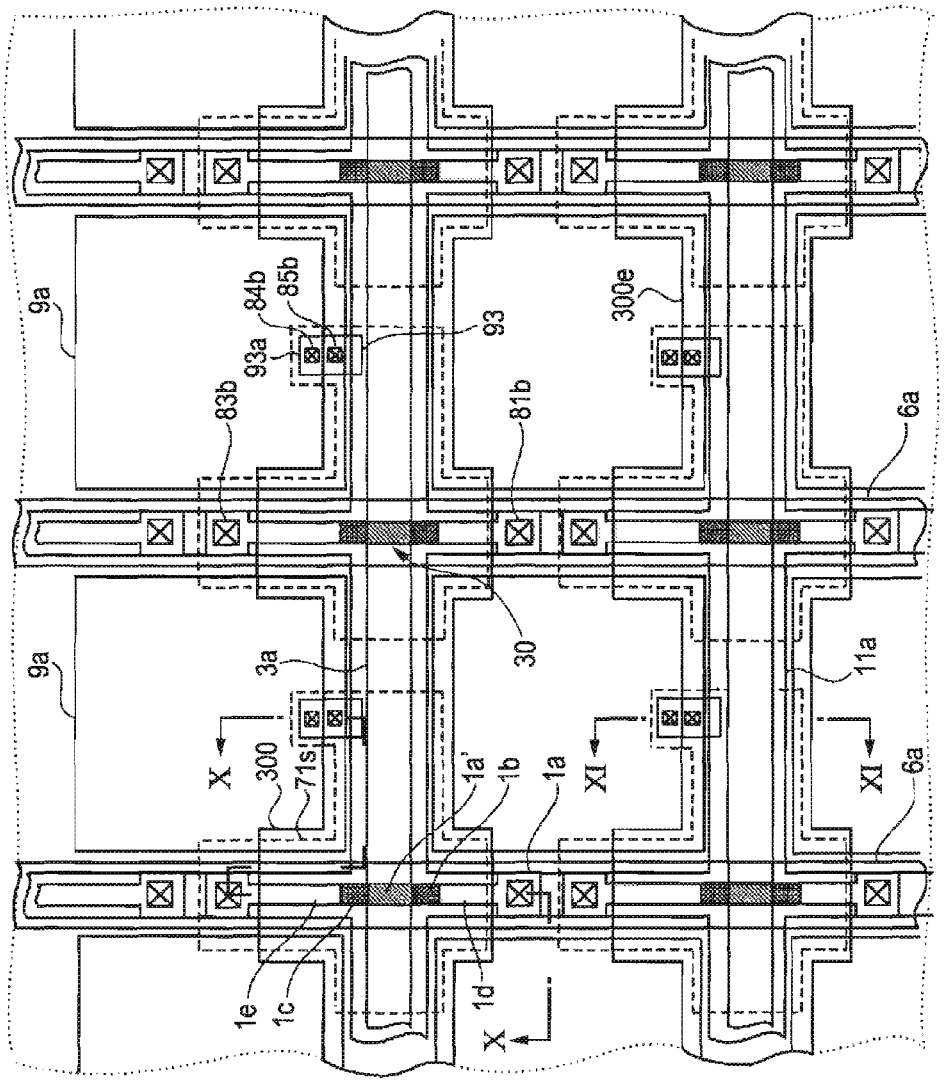
FIG. 9 is a plan view of a plurality of pixels adjacent to each other on a TFT array substrate on which data lines, scanning lines, pixel electrodes, and so forth are formed, in an electro-optical device according to a second exemplary embodiment of the invention.
Figure 10:
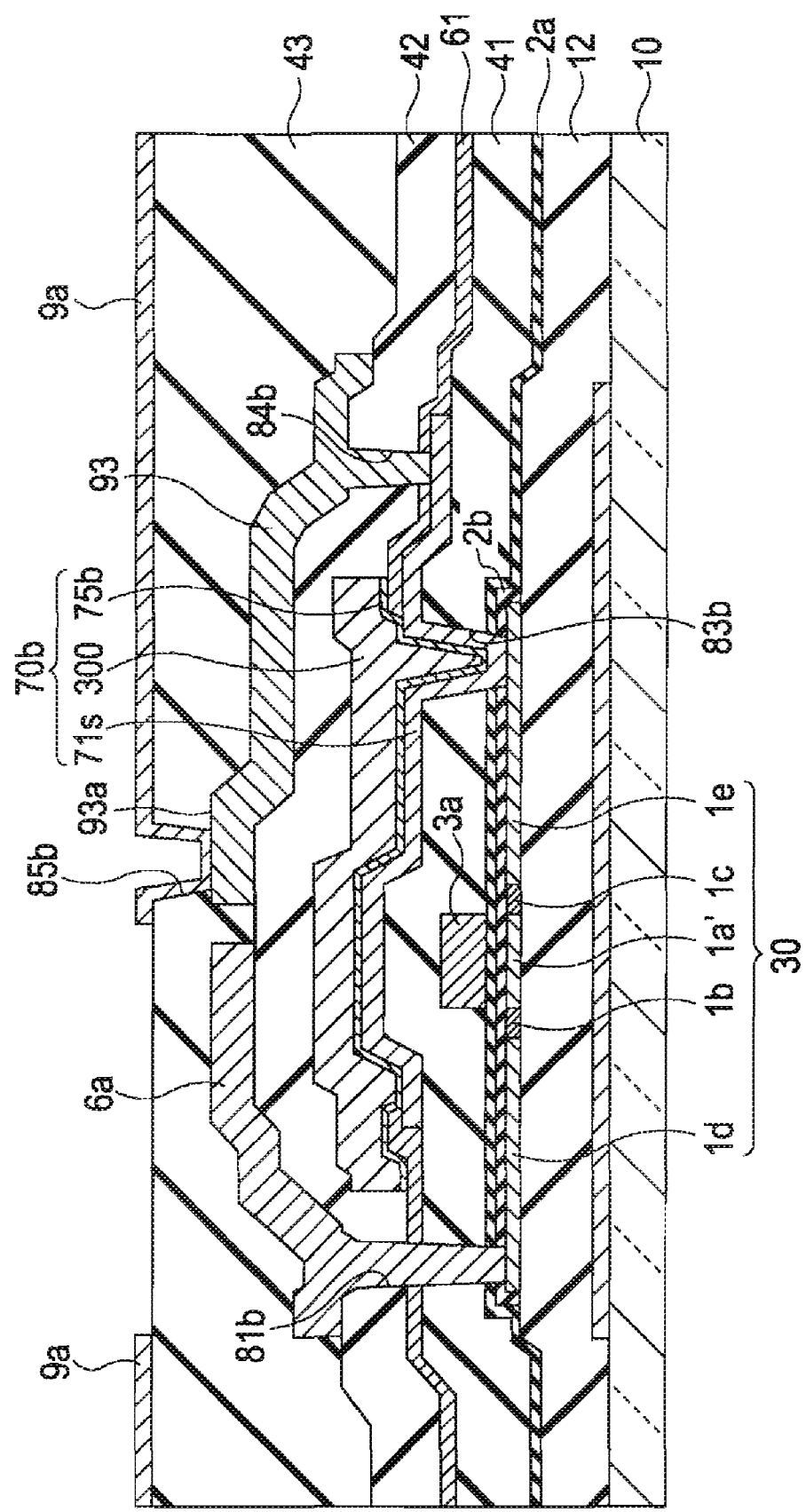
FIG. 10 is a sectional view taken along line X-x of FIG. 9.
Figure 11:
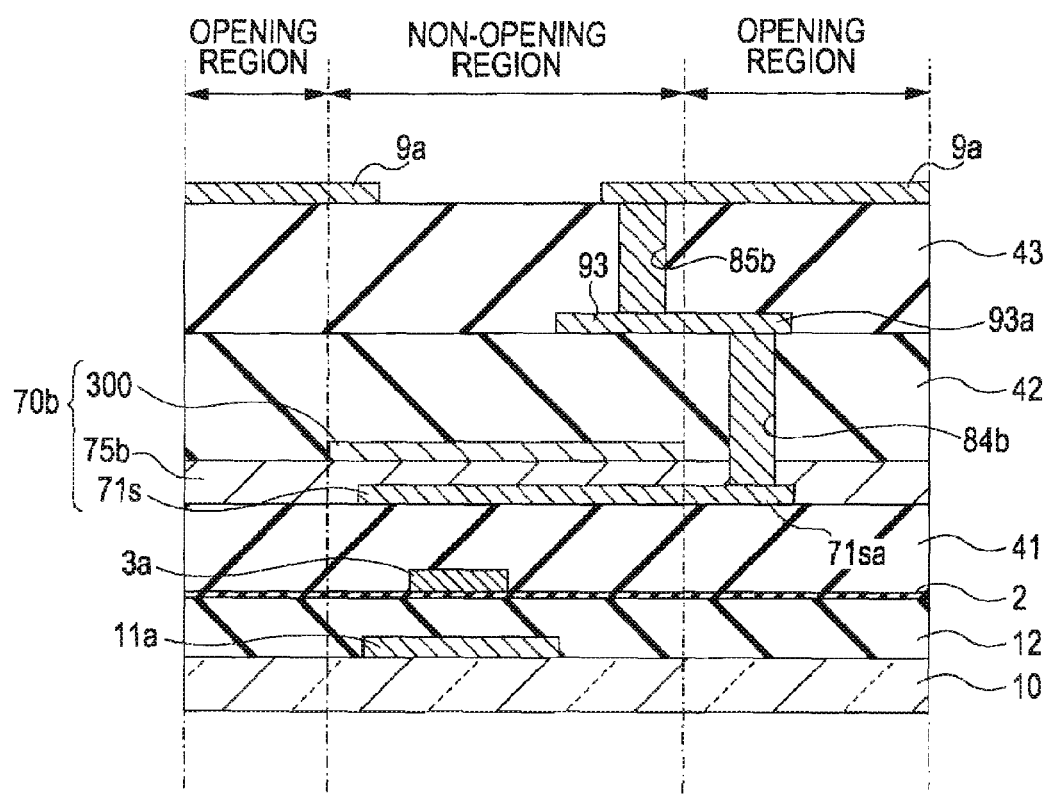
FIG. 11 is a sectional view taken along line XI-XI of FIG. 9.

Next, exemplary embodiments of an electro-optical device substrate and an electro-optical device having the same according to the second aspect of the invention will be described with reference to FIGS. 9 to 11. FIG. 9 is a plan view of a plurality of pixels adjacent to each other on a TFT array substrate 10 on which data lines 6a, scanning lines 3a, pixel electrodes 9a, and so forth are formed. FIG. 10 is a sectional view taken along line X-X of FIG. 9. FIG. 11 is a sectional view taken along line XI-XI of FIG. 9.

Also in FIGS. 9 to 11, as in FIGS. 4 to 6, each layer or each member is shown in a different scale so that each layer or each member can have a sufficiently understandable size. In addition, in FIGS. 10 and 11 for convenience of explanation, the part located above the pixel electrode 9a is not shown, and the same reference numeral will be used to designate the same components as those of the liquid crystal device 1 according to the first exemplary embodiment.

In FIGS. 9 and 10, each pixel of the liquid crystal device of this exemplary embodiment includes a relay layer 93, a storage capacitor 70b, a contact hole 85b, and a contact hole 84b.

The storage capacitor 70b has a lower capacitor electrode 71s extending into the opening region from the non-opening region, an upper capacitor electrode 300, and a dielectric film 75b sandwiched by these electrodes. The upper capacitor electrode 300 is a fixed potential side capacitor electrode. The lower capacitor electrode 71s is a pixel potential side capacitor electrode electrically connected to the heavily-doped drain region 1e of the TFT 30 via the contact hole 83b. The lower capacitor electrode 71s is a semiconductor layer formed of polysilicon, for example. Therefore, the storage capacitor 70b has a so-called MIS (Metal-Insulator-Semiconductor) structure. In addition to the function as a pixel potential side capacitor electrode, the lower capacitor electrode 71s also has the function as a light-absorbing layer or a light-shielding film disposed between the upper capacitor electrode 300 serving as an upper light-shielding film, and the TFT 30. The data line 6a is electrically connected to the heavily-doped source region 1d via a contact hole 81b penetrating the first interlayer insulating film 41, the insulating film 61, and the second interlayer insulating film 42. The insulating film 61 is interposed partially between the first interlayer insulating film 41 and the second interlayer insulating film 42.

As shown in FIG. 9, the lower capacitor electrodes 71s are apart from each other. Therefore, an image signal is supplied to each pixel via the data lines 6a in accordance with the switching operation of the TFTs 30. The upper capacitor electrode 300 extends along the x direction in FIG. 9 across a plurality of pixels. Since the upper capacitor electrode 300 is shared by a plurality of pixels, the area of the upper capacitor electrode 300 is larger than that of the lower capacitor electrode 71s.

However, since the upper capacitor electrode 300 is a film formed of a metal such as aluminum, compared to the case where the upper capacitor electrode 300 is formed of a semiconductor, the increase in electrical resistance due to the increase in area of the electrode is small. Therefore, the power consumption of the liquid crystal device in operation can be reduced. In addition, various elements in each pixel can be driven at a high speed. Therefore, the responsiveness when an image is displayed by the liquid crystal device can be prevented from decreasing. Such advantages are not limited to the case where the upper capacitor electrode 300 is formed so as to extend in the X direction across a plurality of pixels adjacent to each other as in this exemplary embodiment. Such advantages are specifically prominent in the case where the upper capacitor electrode 300 is formed across a plurality of pixels so as to occupy a larger area in the image display area 10a.

Since the contact hole 85b electrically connects the relay layer 93 and the pixel electrode 9a in the non-opening region, the contact hole 85b does not narrow the opening region.

The region edge 190, which is one of the region edges defining an opening region, is defined by the edge 300e of the upper capacitor electrode 300. The protruding portion 93a protrudes into the opening region from a part of the region edge 190. The lower capacitor electrode 71s also extends into the opening region from a part of the region edge 190. Therefore, it is only necessary to extend the part of the lower capacitor electrode 71s connected to the contact hole 84b into the opening region. Unlike in the case where the entire lower capacitor electrode 71s is extended into the opening region, the decrease in opening ratio is small. In addition, as with the first exemplary embodiment, it is possible to narrow the parts of the non-opening region extending on either side of the contact hole 84b along the X direction, and therefore the opening ratio can be increased.

In the case of the liquid crystal device according to this exemplary embodiment, the opening ratio can be improved, with the electrical connection between the pixel electrode 9a, the relay layer 93, and the storage capacitor 70b secured. Therefore, it is possible to improve the quality of the image displayed by the liquid crystal device.

Next, with reference to FIG. 11, the electrical connection structure between the pixel electrode 9a and the lower capacitor electrode 71s will be described in detail.

In FIG. 11, the lower capacitor electrode 71s has a first portion 71sa extending into the opening region from the non-opening region and not located under the upper capacitor electrode 300. The relay layer 93 has a protruding portion 93a protruding into the opening region from the non-opening region.

The contact hole 84b electrically connects the first portion 71sa and the relay layer 93. The contact hole 85b electrically connects the pixel electrode 9a and the relay layer 93. Therefore, an image signal is supplied to the pixel electrode 9a via the lower capacitor electrode 71s electrically connected to the drain of the TFT 30 formed in the non-opening region, and an image is displayed.

As described above, an electro-optical device, such as a liquid crystal device, having the electro-optical device substrate according to this exemplary embodiment can temporarily hold the potential of the pixel electrode 9a with a storage capacitor and has a high opening ratio, and therefore can display a high-quality image.

As in the first exemplary embodiment, also in this exemplary embodiment, a high opening ratio can be achieved by protruding the protruding portion 93a into the opening region from the center of the region edge 190, a position off the center of the region edge 190, or a corner of the opening region. In addition, since the hold capacitor 70b is provided directly above the TFT 30, the hold capacitor 70b can block light obliquely incident on the semiconductor layer 1a at a large angle with respect to the normal direction to the semiconductor layer 1a. In addition, since the relay layers 93 are formed in the same layer as the data lines 6a, the manufacturing process of the liquid crystal device can be simplified.

Electronic Apparatus

Figure 12:
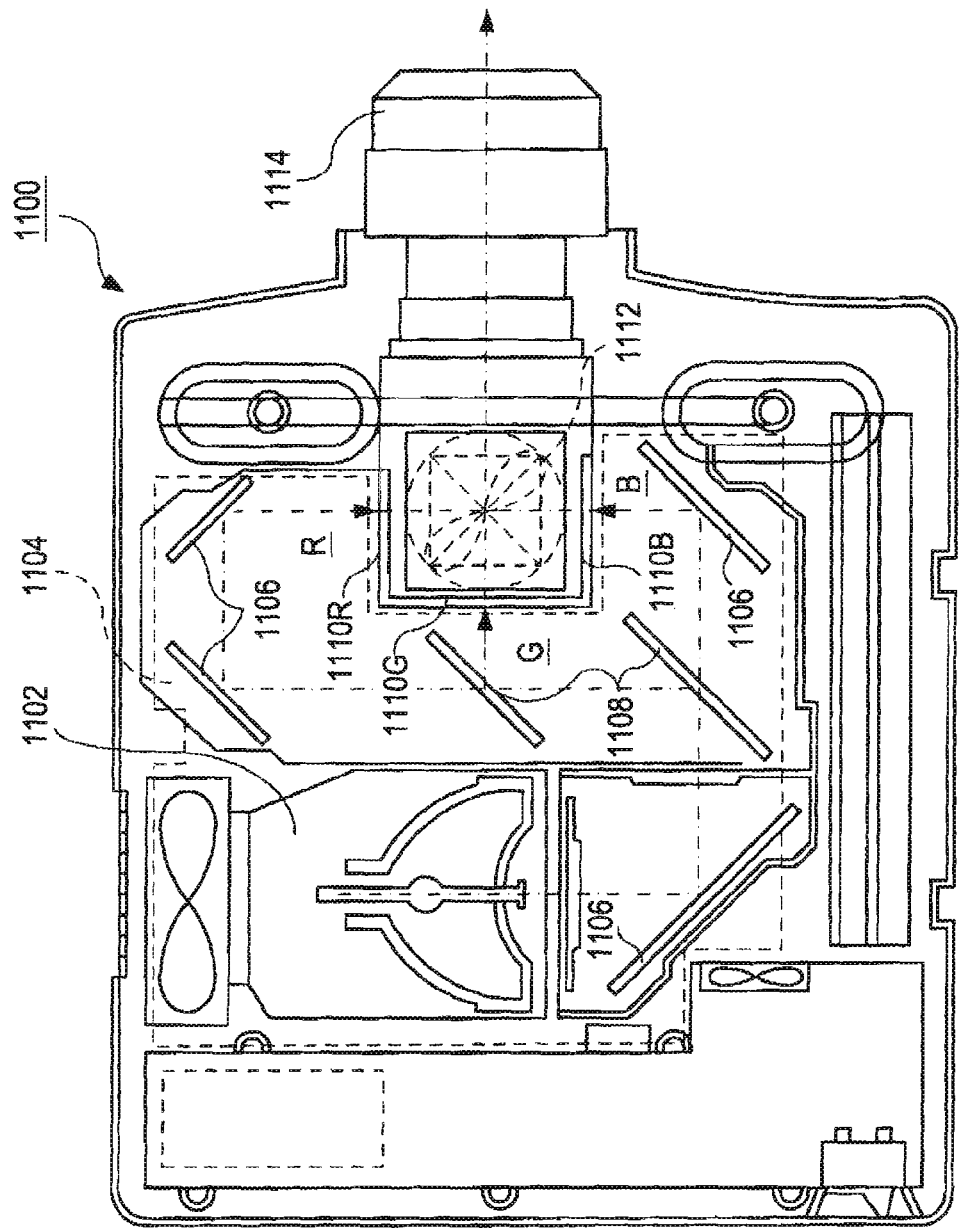
FIG. 12 is a plan view showing an example of an electronic apparatus including the electro-optical device according to the exemplary embodiment.

Next, application of the above-described liquid crystal device to various electronic apparatuses will be described with reference to FIG. 12. The electronic apparatus according to this exemplary embodiment is a projector including the above-described liquid crystal device as a light valve. FIG. 12 is a plan view showing the configuration of a projector, which is an example of an electronic apparatus including the above-described liquid crystal device. As shown in FIG. 12, a projector 1100 has a lamp unit 1102, which is a white light source, for example, a halogen lamp. The light emitted from this lamp unit 1102 is separated into light components of three primary colors of RGB by four mirrors 1106 and two dichroic mirrors 1108 disposed in a light guide 1104. The light components are then incident on liquid crystal panels 1110R, 1110B, and 1110G, which serve as light valves corresponding to the primary colors.

The liquid crystal panels 1110R, 1110B, and 1110G nave the same configuration as the above-described liquid crystal device, and are driven by primary color signals of R, G, and B supplied from an image signal processing circuit. The light components modulated by these liquid crystal panels are incident on a dichroic prism 1112 from three directions. In this dichroic prism 1112, while the light components of R and B are refracted at 90 degrees, the light component of G goes straight. Therefore, images of three primary colors are synthesized, and consequently a color image is projected onto a screen or the like via a projector lens 1114.

The display image of the liquid crystal panel 1110G is a mirror-reversed image of the display images of the liquid crystal panels 1110R and 1110B. Light components corresponding to primary colors of R, G, and B are Incident on the liquid crystal panels 1110R, 1110B, and 1110G due to the dichroic mirrors 1108. Therefore, it is not necessary to provide a color filter in each liquid crystal panel.

Since the electronic apparatus according to this exemplary embodiment includes the above-described liquid crystal device, it is possible to realize various electronic apparatuses, such as a projection display apparatus, a cellular phone, a personal digital assistance, a word processor, a viewfinder-type or monitor-direct-view-type video tape recorder, a workstation, a video phone, a POS terminal, and a touch panel, that are capable of high-quality display and that are small.

The entire disclosure of Japanese Patent Application No. 2006-131084, filed May 10, 2006 is expressly incorporated by reference herein.

What is claimed is:

1. An electro-optical device substrate comprising:
   a substrate;
   a data line extending along a first direction on the substrate;
   a pixel electrode of which a voltage is set according to a data signal transmitted by the data line;
   a pixel corresponding to the pixel electrode;
   a transistor corresponding to the pixel electrode, the transistor including a semiconductor layer that extends along the first direction and overlaps with the data line;
   a light-shielding film defining a part of an opening region of the pixel, the light-shielding film overlapping at least a part of the semiconductor layer and extending along a second direction;
   a hold capacitor holding a potential of the pixel electrode, the hold capacitor disposed in a non-opening region in which the light-shielding film is formed;
   a conducting layer having a protruding portion protruding into the opening region along the first direction from a region in which the light-shielding film that defines a part of a region edge following the second direction of the opening region is formed;
   a first contact portion electrically connecting the pixel electrode and the protruding portion, the first contact portion being formed so as to not overlap the light-shielding film; and
   a second contact portion electrically connecting the conducting layer and the hold capacitor, the second contact portion being formed so as to overlap the light-shielding film, wherein the first and second contact portions are arranged along the first direction.

2. The electro-optical device substrate according to claim 1, wherein the hold capacitor includes a first electrode, a second electrode formed over the first electrode, and a dielectric film sandwiched between the first electrode and the second electrode;
   the second electrode is formed in the light-shielding film, and
   a second contact portion electrically connecting the conducting layer and the light-shielding film.

3. The electro-optical device substrate according to claim 1, wherein the hold capacitor is formed between the substrate and the conducting layer.

4. The electro-optical device substrate according to claim 1, wherein a first electrode and a second electrode are metal films.

5. The electro-optical device substrate according to claim 1, wherein the one region edge extends along the direction in which the scanning lines extend, and the protruding portion protrudes into the opening region from the center of the one region edge.

6. The electro-optical device substrate according to claim 1, wherein the one region edge extends along the direction in which the scanning lines extend, and the protruding portion protrudes into the opening region from a position off the center of the one region edge.

7. The electro-optical device substrate according to claim 1, wherein the protruding portion protrudes into the opening region from a corner of the opening region.

8. The electro-optical device substrate according to claim 1, wherein each pixel further includes a transistor whose source is electrically connected to one of the data lines and whose gate is electrically connected to one of the scanning lines, and the hold capacitor is disposed directly above the transistor.

9. The electro-optical device substrate according to claim 1, wherein the conducting layer is formed in the same layer as the data lines.

10. An electro-optical device comprising the electro-optical device substrate according to claim 1.

11. An electronic apparatus comprising the electro-optical device according to claim 10.

12. An electro-optical device substrate comprising:
   a substrate;
   a plurality of data lines on the substrate; and
   a plurality of pixels defined by the plurality of data lines, each pixel including:
   a pixel electrode of which a voltage is set according to a data signal transmitted by the data line;
   a conducting layer formed in a non-opening region separating an opening region of the pixel from that of another pixel, the conducting layer having a protruding portion protruding into the opening region from a part of one of a plurality of region edges defining the opening region, a light-shielding film only overlapping at least a portion of the conducting layer;
   a hold capacitor including a first electrode extending from the non-opening region into the opening region, a second electrode formed over the first electrode, and a dielectric film sandwiched by the first electrode and the second electrode, the hold capacitor temporarily holding a potential of the pixel electrode in accordance with an image signal supplied to the pixel electrode;
   a first contact portion electrically connecting the conducting layer and the pixel electrode in the non-opening region, the first contact portion being formed so as to not overlap the light-shielding film; and
   a second contact portion electrically connecting the protruding portion and the first electrode, the second contact portion being formed so as to overlap the light-shielding film, wherein the first and second contact portions are arranged in a line that is parallel to the data lines.

13. The electro-optical device substrate according to claim 12, wherein the first electrode is a semiconductor layer having a first portion that extends into the opening region from the non-opening region and that is not located under the second electrode, and the second contact portion is electrically connected to the first portion.

* * * * *